(12) United States Patent
Matsumoto

(10) Patent No.: US 8,759,799 B2
(45) Date of Patent: Jun. 24, 2014

(54) CHARGED PARTICLE BEAM WRITING APPARATUS AND CHARGED PARTICLE BEAM WRITING METHOD

(71) Applicant: NuFlare Technology, Inc., Numazu (JP)

(72) Inventor: Hironobu Matsumoto, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 51 days.

(21) Appl. No.: 13/669,716

(22) Filed: Nov. 6, 2012

(65) Prior Publication Data
US 2013/0134329 A1    May 30, 2013

(30) Foreign Application Priority Data
Nov. 30, 2011  (JP) ................... 2011-261561

(51) Int. Cl.
*H01J 37/02* (2006.01)
*H01J 37/302* (2006.01)
*G03F 7/20* (2006.01)

(52) U.S. Cl.
CPC ......... *H01J 37/3026* (2013.01); *G03F 7/70625* (2013.01)
USPC ............... 250/492.22; 250/492.2; 250/492.3; 716/53

(58) Field of Classification Search
CPC ... G21K 5/10; G03F 7/70558; G03F 7/70625; H01J 37/30; H01J 37/302; H01J 37/3023; H01J 37/3026
USPC ............... 250/492.2, 492.21, 492.22, 492.3; 716/53
See application file for complete search history.

(56) References Cited

U.S. PATENT DOCUMENTS

| | | | |
|---|---|---|---|
| 5,863,682 A * | 1/1999 | Abe et al. ................... | 430/30 |
| 2007/0114459 A1* | 5/2007 | Suzuki et al. ............ | 250/492.22 |
| 2007/0192757 A1* | 8/2007 | Emi et al. ................... | 716/20 |
| 2009/0057575 A1* | 3/2009 | Oogi et al. ............... | 250/492.22 |

(Continued)

FOREIGN PATENT DOCUMENTS

| | | |
|---|---|---|
| JP | 3469422 | 9/2003 |
| JP | 2011-228503 | 11/2011 |

OTHER PUBLICATIONS

U.S. Appl. No. 13/669,716, filed Nov. 6, 2012, Matsumoto.
U.S. Appl. No. 13/961,101, filed Aug. 7, 2013, Matsumoto.

(Continued)

*Primary Examiner* — Michael Logie
*Assistant Examiner* — David E Smith
(74) *Attorney, Agent, or Firm* — Oblon, Spivak, McClelland, Maier & Neustadt, L.L.P.

(57) ABSTRACT

A charged particle beam writing apparatus according to an embodiment, includes a dose coefficient calculation unit to calculate an n-th dose correction coefficient in iterative calculation of a charged particle beam to be shot in a small region concerned by the iterative calculation, for each small region of small regions made by virtually dividing into mesh-like regions, a change rate calculation unit to calculate, for each small region, a rate of change from an (n-1)th dose correction coefficient to the n-th dose correction coefficient calculated in the iterative calculation, as an n-th change rate, a correction calculation unit to correct, for each small region, the n-th dose correction coefficient by using the n-th change rate, and a dose calculation unit to calculate, for each small region, a dose of a charged particle beam to be shot in a small region concerned by using the n-th dose correction coefficient corrected.

20 Claims, 8 Drawing Sheets

(56) References Cited

U.S. PATENT DOCUMENTS

2011/0253912 A1* 10/2011 Matsumoto .............. 250/492.22
2012/0085940 A1 4/2012 Matsumoto
2013/0134329 A1 5/2013 Matsumoto

OTHER PUBLICATIONS

Takayuki Abe et al. "High Accuracy Proximity Effect Correction for Mask Writing", Japanese Journal of Applied Physics vol. 46, No. 2, 2007 pp. 826-833.

* cited by examiner

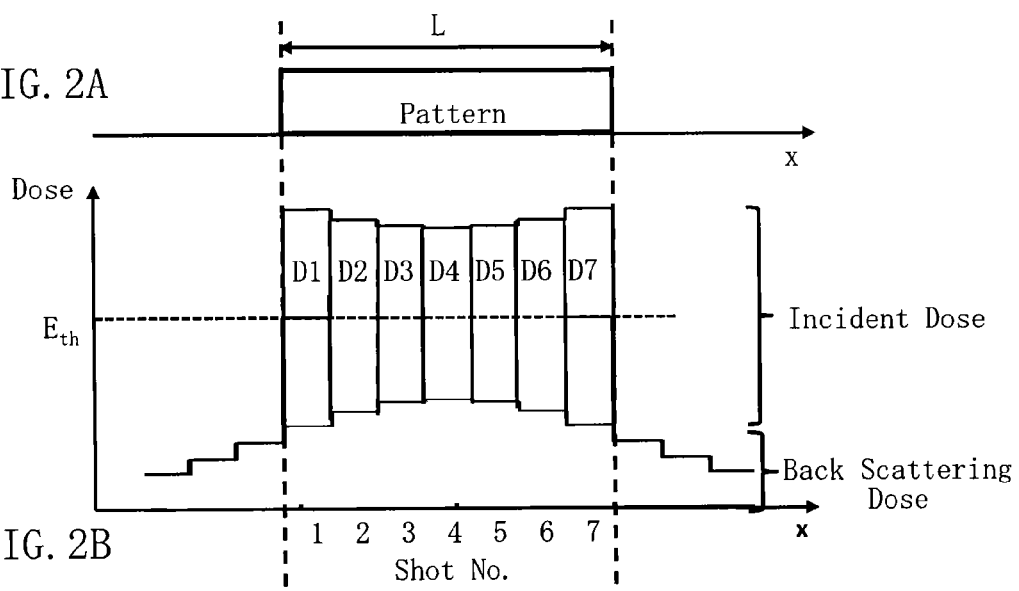
FIG. 2A
FIG. 2B
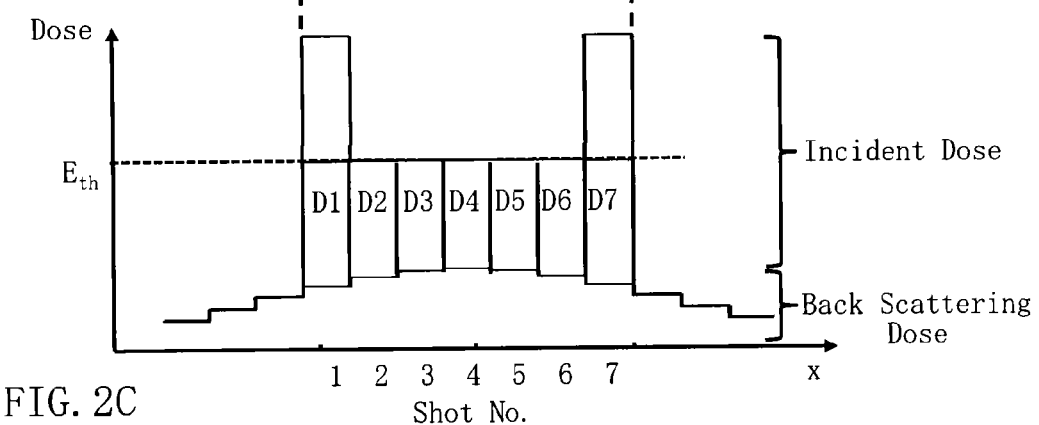
FIG. 2C

CHARGED PARTICLE BEAM WRITING APPARATUS AND CHARGED PARTICLE BEAM WRITING METHOD

CROSS-REFERENCE TO RELATED APPLICATION

This application is based upon and claims the benefit of priority from the prior Japanese Patent Application No. 2011-261561, filed on Nov. 30, 2011, in Japan, the entire contents of which are incorporated herein by reference.

BACKGROUND OF THE INVENTION

1. Field of the Invention

The present invention relates to a charged particle beam writing apparatus and a charged particle beam writing method. For example, the present invention relates to a method for calculating a dose of electron beam radiation used for electron beam writing.

2. Description of Related Art

The lithography technique that advances microminiaturization of semiconductor devices is extremely important as being a unique process whereby patterns are formed in the semiconductor manufacturing. In recent years, with high integration of LSI, the line width (critical dimension) required for semiconductor device circuits is decreasing year by year. In order to form a desired circuit pattern on semiconductor devices, a master or "original" pattern (also called a mask or a reticle) of high precision is needed. Thus, the electron beam (EB) writing technique, which intrinsically has excellent resolution, is used for producing such a highly precise master pattern.

FIG. 10 is a schematic diagram explaining operations of a conventional variable shaped electron beam (EB) writing apparatus. As shown in the figure, the variable shaped electron beam writing apparatus operates as described below. A first aperture plate 410 has a quadrangular opening 411 for shaping an electron beam 330. A second aperture plate 420 has a variable-shape opening 421 for shaping the electron beam 330 having passed through the opening 411 of the first aperture plate 410 into a desired quadrangular shape. The electron beam 330 emitted from a charged particle source 430 and having passed through the opening 411 is deflected by a deflector to pass through apart of the variable-shape opening 421 of the second aperture plate 420, and thereby to irradiate a target object or "sample" 340 placed on a stage which continuously moves in one predetermined direction (e.g. X direction) during the writing. In other words, a quadrangular shape that can pass through both the opening 411 and the variable-shape opening 421 is used for pattern writing in a writing region of the target object 340, on the stage continuously moving in the X direction. This method of forming a given shape by letting beams pass through both the opening 411 of the first aperture plate 410 and the variable-shape opening 421 of the second aperture plate 420 is referred to as a variable shaped beam (VSB) method.

In the electron beam writing described above, the dose of each beam shot is set such that a beam dose at the end of a figure configured by connecting a plurality of shots is to be a threshold value of a dose required for resist pattern resolution. Usually, it is set such that about half the maximum of irradiation energy of a shot dose at the figure end reaches the threshold value. For calculating a dose, one dose equation is used regardless of position of the irradiation. Therefore, when writing a figure configured by connecting a plurality of shots, the dose is set in each shot such that about half the maximum of irradiation energy reaches a threshold value, irrespective of whether it is at the figure end or not.

On the other hand, along with recent tendency of microminiaturization of patterns, the time period of performing writing by the writing apparatus becomes long. Accordingly, it is required to shorten the time period. However, since it needs to enter a calculated dose into the resist in order to write a pattern in accordance with sizes, the conventional method has a limit in shortening the writing time.

Here, in relation to a dose equation used in electron beam writing, there is a method of calculating a dose by changing values, such as a base dose $D_{base}$, used for calculating a dose and a back scattering coefficient η used for correcting a proximity effect, depending on positions in order to correct a phenomenon called a proximity effect etc. However, even in such a method, the dose equation itself used in the method is the same one, and then variables therein are adjusted.

As described above, conventionally, dose of each shot is calculated by using one dose equation which is set in the writing apparatus. When performing irradiation based on an incident dose calculated by the conventional dose equation, all the doses at each of all the regions except for a figure end and for a place on which nothing is written are larger than a threshold value of the resist. In order for all the doses at the figure end to be the threshold value of the resist, all the doses in the vicinity of the figure end need to be larger than the threshold value of the resist.

However, it is enough for all the doses in regions sufficiently distant from the figure end to be about the threshold value. This subject has not been taken into consideration in the conventional method. Therefore, for example, in the case of writing a figure configured by connecting a plurality of shots, if an incident dose of a region inside a figure away from the figure end by a sufficient distance longer than the radius of forward scattering of beam is calculated by using the conventional method, the dose of the region is larger than the threshold value of the resist. That is, when a dose is large, the irradiation time becomes long in accordance with the dose. Thus, as has been described, an excessive dose exists depending on a figure or its irradiation position, and accordingly, there is a problem of taking a writing time longer than needed because of such excessive dose.

BRIEF SUMMARY OF THE INVENTION

In accordance with one aspect of the present invention, a charged particle beam writing apparatus includes a dose coefficient calculation unit to calculate an n-th dose correction coefficient in iterative calculation of a charged particle beam to be shot in a small region concerned by the iterative calculation, for each small region of a plurality of small regions made by virtually dividing a writing region of a target object into mesh-like regions, a change rate calculation unit to calculate, for each small region, a rate of change from an (n-1)th dose correction coefficient to the n-th dose correction coefficient calculated in the iterative calculation, as an n-th change rate, a correction calculation unit to correct, for each small region, the n-th dose correction coefficient by using the n-th change rate, a dose calculation unit to calculate, for each small region, a dose of a charged particle beam to be shot in a small region concerned by using the n-th dose correction coefficient corrected, and a writing unit to write a desired pattern in the small region concerned by using the dose calculated.

In accordance with another aspect of the present invention, a charged particle beam writing method includes calculating an n-th dose correction coefficient in iterative calculation of a charged particle beam to be shot in a small region concerned by the iterative calculation, for each small region of a plurality of small regions made by virtually dividing a writing region of a target object into mesh-like regions, calculating, for each small region, a rate of change from an (n-1)th dose correction coefficient to the n-th dose correction coefficient calculated in the iterative calculation, as an n-th change rate, correcting, for each small region, the n-th dose correction coefficient by using the n-th change rate, calculating, for each small region, a dose of a charged particle beam to be shot in the small region concerned by using the n-th dose correction coefficient corrected, and writing a desired pattern in the small region concerned by using the dose calculated.

BRIEF DESCRIPTION OF THE DRAWINGS

FIGS. 2A to 2C show an example of a beam profile for explaining comparison between a dose according to Embodiment 1, and a conventional dose;

DETAILED DESCRIPTION OF THE INVENTION

Although the inventor of the present invention has proposed a method of using different dose equations at a figure end and at a region inside the figure (refer to e.g., Japanese Patent Application Laid-open (JP-A) No. 2011-228503), it is requested to further reduce the convergence time in the equations used.

As described above, since convergence may take time when calculating a dose in the conventional dose equation, it has turned out that there maybe a case in which dose shortage is caused by unfinished convergence if calculation is performed by a predetermined number of times of iteration. However, no sufficient method has been established conventionally for this problem. Although it is possible to increase the number of times of iteration, such an increase will result in lengthening the operation time and thus affecting the writing time. For reducing the writing time in view of data amount increase with along the recent microminiaturization of patterns, it is desirable to shorten the operation time of dose calculation.

Embodiment 1

In the following Embodiments, there will be described a structure in which an electron beam is used as an example of a charged particle beam. The charged particle beam is not limited to the electron beam, and other charged particle beam, such as an ion beam, may also be used. Moreover, a variable-shaped electron beam writing apparatus will be described as an example of the charged particle beam apparatus.

Furthermore, in the Embodiment hereafter, there will be described an apparatus and a method that can expedite convergence of solution in calculating an irradiation dose by iterative calculation.

Figure 1:
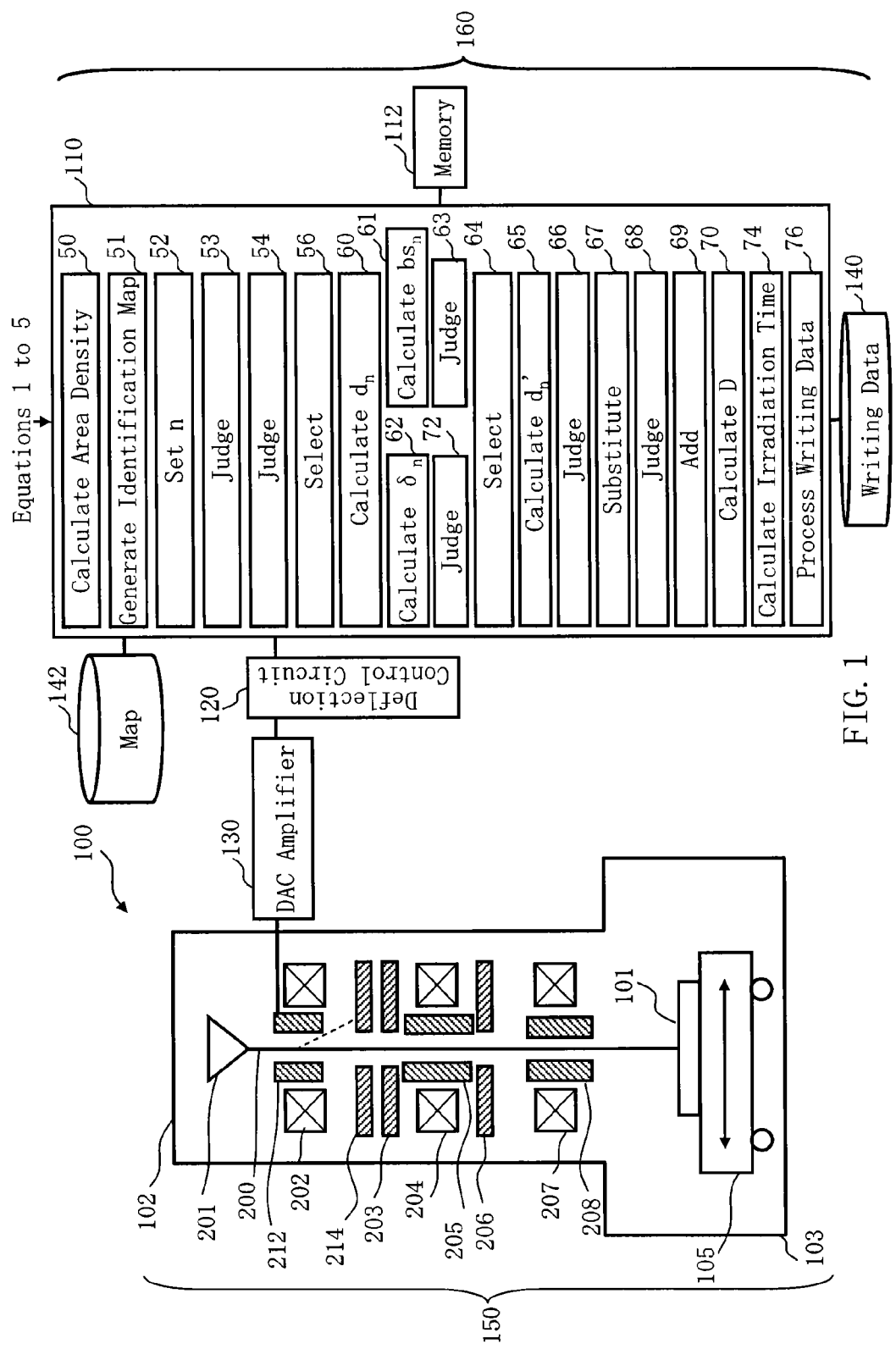
FIG. 1 is a schematic diagram showing a structure of a writing apparatus according to Embodiment 1.

FIG. 1 is a schematic diagram showing a structure of a writing apparatus according to Embodiment 1. In FIG. 1, a writing apparatus 100 includes a writing unit 150 and a control unit 160. The writing apparatus 100 is an example of a charged particle beam writing apparatus, and especially, an example of a variable-shaped electron beam (VSB) writing apparatus. The writing unit 150 includes an electron lens barrel 102 and a writing chamber 103. In the electron lens barrel 102, there are arranged an electron gun assembly 201, an illumination lens 202, a blanking deflector (blanker) 212, a blanking aperture 214, a first shaping aperture 203, a projection lens 204, a deflector 205, a second shaping aperture 206, an objective lens 207, and a deflector 208. In the writing chamber 103, there is arranged an XY stage 105 which is movable at least in the XY direction. On the XY stage 105, a target object 101 serving as a writing target is placed. The target object 101 is, for example, a mask for exposure, a silicon wafer, etc. used for manufacturing semiconductor devices. The mask is, for example, a mask blank where no patterns are formed.

The control unit 160 includes a control computer 110, a memory 112, a deflection control circuit 120, a DAC (digital analog converter) amplifier unit 130 (deflection amplifier), and storage devices 140 and 142, such as a magnetic disk drive. The control computer 110, the memory 112, the deflection control circuit 120, and the storage devices 140 and 142 are mutually connected through a bus (not shown). The deflection control circuit 120 is connected to the DAC amplifier unit 130, and this unit 130 is connected to the blanking deflector 212.

A digital signal for blanking control is output from the deflection control circuit 120 to the DAC amplifier unit 130. Then, in the DAC amplifier unit 130, the digital signal is converted to an analog signal, and amplified to be applied as a deflection voltage to the blanking deflector 212. The electron beam 200 is deflected by the deflection voltage, to be formed as a beam of each shot.

Moreover, in the control computer 110, there are arranged an area density calculation unit 50, an identification map generation unit 51, an iteration number (n) setting unit 52, judging units 53 and 54, a selecting unit 56, a coefficient $d_n$ calculation unit 60, a back scattering component coefficient $bs_n$ calculation unit 61, a change rate on calculation unit 62, a judging unit 63, a selecting unit 64, a coefficient $d_n'$ calculation unit 65, a judging unit 66, a substitution unit 67, a judging unit 68, an addition unit 69, a judging unit 72, a dose D calculation unit 70, an irradiation time calculation unit 74, and a writing data processing unit 76. Each function of them may be configured by software such as a program, or it may be configured by hardware such as an electronic circuit. Alternatively, it maybe configured by a combination of software and hardware. Input data necessary for the control computer 110 or a calculated result is stored in the memory 112 each time. Similarly, the deflection control circuit 120 may be configured by a computer operated by software such as a program, or may be configured by hardware such as an electronic circuit etc. Alternatively, it may be configured by a combination of software and hardware. Here, FIG. 1 shows a structure necessary for describing Embodiment 1. Other structure elements generally necessary for the writing apparatus 100 may also be included. For example, a DAC amplifier unit for the deflector 205 or 208 is of course included.

FIGS. 2A to 2C show an example of a beam profile for explaining comparison between a dose according to Embodiment 1, and a conventional dose in the case of writing a figure pattern having a pattern width L shown in FIG. 2A. FIG. 2B shows a dose profile according to a conventional correction method, and an incident dose of each beam shot is set such that all the doses at each shot edge are to be a dose threshold value Eth of a dose required for resist pattern resolution even if no adjoining shot exists. Then, the incident dose of each shot is set to be twice the value obtained by subtracting a back scattering dose at the shot position from the dose threshold value Eth of a dose required for resist pattern resolution. However, for example, since dimension variation under the influence of forward scattering at a position such as a shot 2, 3, . . . , 6, inside the figure is an ignorable amount, it is sufficient for the energy maximum value of a beam to be shot at such a position, ideally, to be up to the threshold value Eth of a dose required for resist pattern resolution. Then, according to Embodiment 1, as shown in FIG. 2C, each of doses D2 to D6 at the region inside the figure pattern is set to be a value obtained by subtracting a back scattering dose at the shot position from the dose threshold value Eth of a dose required for resist pattern resolution. Since the dose at each of the regions 2 to 6 inside the figure pattern is decreased owing to such a configuration, the shot irradiation time can be reduced. Hereafter, the processing flow will be explained specifically.

Figure 3:
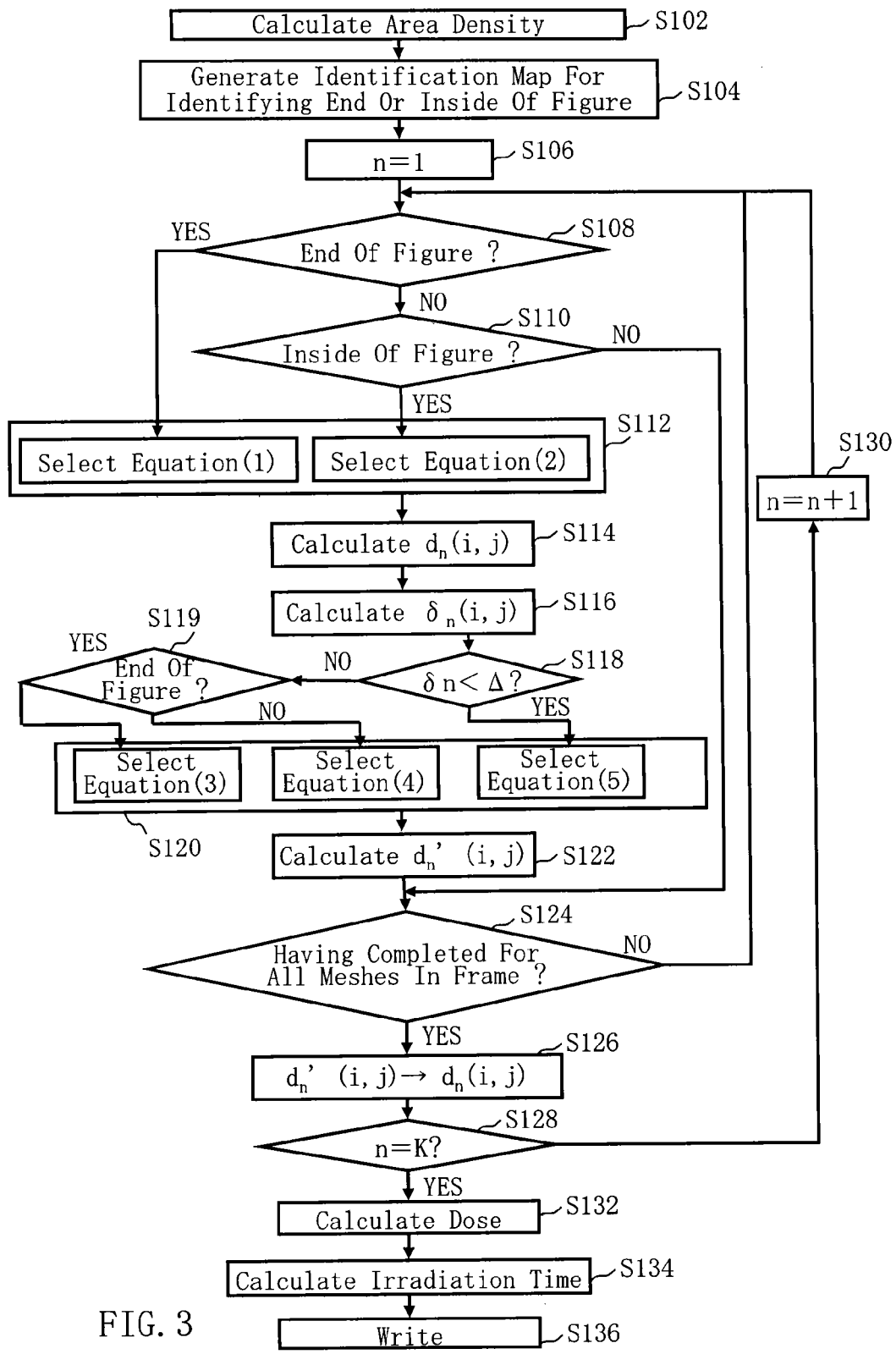
FIG. 3 is a flowchart showing main steps of a writing method according to Embodiment 1.

FIG. 3 is a flowchart showing main steps of a writing method according to Embodiment 1. In FIG. 3, the writing method according to Embodiment 1, executes a series of steps: an area density calculation step (S102), an identification map generation step (S104) for generating a map for identifying being at the end of a figure or inside of a figure, an iteration number n setting step (S106), a judgment step (S108), a judgment step (S110), a selection step (S112), a $d_n(i,j)$ calculation step (S114), a $\delta_n(i, j)$ calculation step (S116), a judgment step (S118), a judgment step (S119), a selection step (S120), a $d_n'(i,j)$ calculation step (S122), a judgment step (S124), a substitution step (S126), a judgment step (S128), an addition step (S130), a dose D calculation step (S132), an irradiation time calculation step (S134), and a writing step (S136).

First, writing data is input from the outside of the writing apparatus 100 and stored in the storage device 140. Then, in the writing apparatus 100, the writing data processing unit 76 reads the writing data, which was fed from the outside, from the storage device 140, and performs data conversion processing of a plurality of steps. Shot data unique to the writing apparatus is generated by the conversion processing of a plurality of steps. Then, writing processing will be performed based on the shot data.

The writing surface of the target object 101 is virtually divided into a plurality of frame regions each being a writing region as a unit of calculation processing. Then, data processing in a plurality of frame regions are performed in parallel by a plurality of CPUs, etc. (not shown). The parallel processing is performed in order from the side of the frame region to be written first.

Moreover, the writing surface of the target object 101 is virtually divided into mesh-like regions (an example of a small region) of a predetermined mesh size. The mesh size is to be larger than an influence radius of forward scattering of the electron beam 200. For example, it is preferable for the predetermined mesh size to be larger than $3\sigma$ of a forward scattering distribution of the electron beam 200. Moreover, it is preferable for the mesh size to be larger than the minimum shot size.

In the area density calculation step (S102), the area density calculation unit 50 reads writing data for each frame region from the storage device 140, and calculates a pattern area density $\rho$ in the mesh region at each mesh position.

Figure 4:
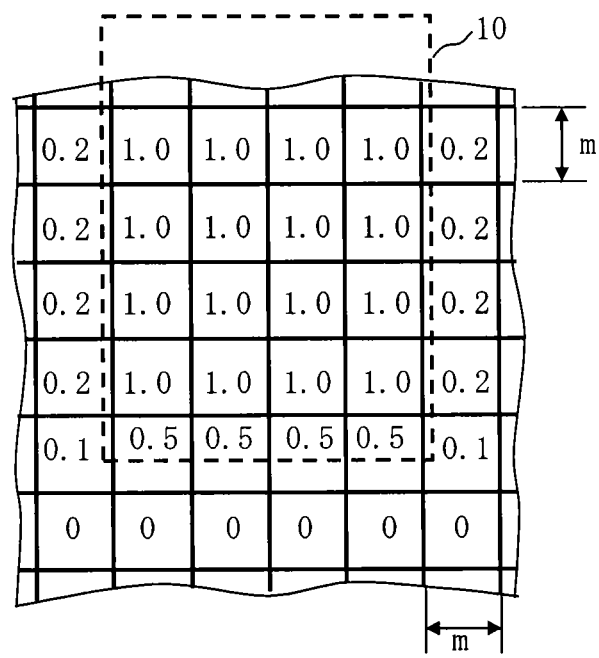
FIG. 4 shows an example of an area density map according to Embodiment 1.

FIG. 4 shows an example of an area density map according to Embodiment 1. A pattern 10 is shown by the dotted line in FIG. 4. As shown in the figure, the area density of the mesh region completely covered with the pattern 10 is 1.0, (100%). The area density of the mesh region which is not covered with the pattern 10 at all is 0(0%). Since figure ends of the pattern 10 overlap with a part of the mesh region, area densities are calculated respectively according to the area of a region in which the figure end is included. FIG. 4 shows an example being divided into grids by a mesh size m.

In the identification map generation step (S104) for generating a map for identifying being at the end of a figure or inside of a figure, the identification map generation unit 51 generates an identification map, for each mesh region, for identifying whether a mesh region concerned is located at the end of a figure or at the inside of a figure.

Figure 5:
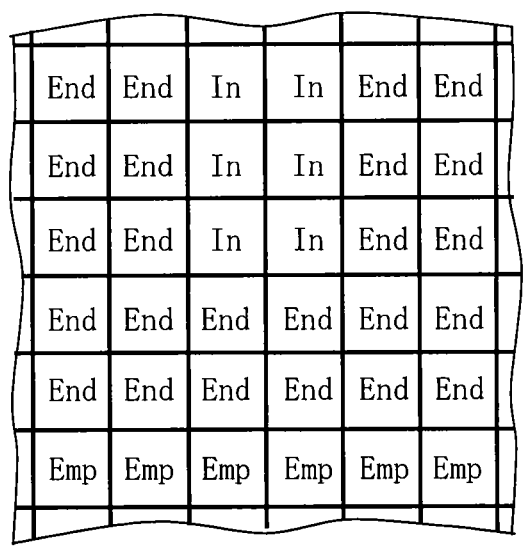
FIG. 5 shows an example of the identification map for identifying end or inside of figure according to Embodiment 1.

FIG. 5 shows an example of the identification map for identifying end or inside of figure according to Embodiment 1. In FIG. 5, a mesh region, whose own pattern area density $\rho$ is 100% and pattern area densities $\rho$ of all the mesh regions surrounding which are 100% respectively, is denoted as being inside the figure (shown as "in"). Then, a mesh region, which does not correspond to the conditions just stated above and whose own area density $\rho$ is not 0%, is denoted as being end of the figure (shown as "end"). A mesh region whose area density $\rho$ is 0% and no pattern is arranged therein from the first, is denoted as being "empty" (shown as "emp"). For example, in FIG. 5, since the area density of each mesh region at the bottom row is 0%, each of them is shown as "emp". As the area density of each mesh region in the second row from the bottom is neither 0% nor 100%, each of them is denoted as "end", and further, as the area density of each mesh region at the right or left end of the figure and in and after the third row from the bottom is also neither 0% nor 100%, each of them is also denoted as "end". With respect to each mesh region in and after the third row from the bottom and in the second column inward from the right or left end of the figure, each of them is denoted as "end" because, although its pattern area density $\rho$ is 100%, there are its surrounding mesh regions whose pattern area densities $\rho$ are not 100%. Similarly, with respect to each of other remaining mesh regions in the third row from the bottom, although its pattern area density $\rho$ is 100%, since there are its surrounding mesh regions whose pattern area densities $\rho$ are not 100%, each mesh region is denoted as "end". On the other hand, each mesh region in and after the fourth row from the bottom and in the third column inward from the right or left end of the figure is denoted as "in" because its pattern area density $\rho$ (i,j) is 100% and pattern area densities $\rho$ of all of its surrounding mesh regions are 100% respectively. In this case, although "in", "end", and "emp" are used for denotation, what is necessary in an actual identification map is just to identify them as discriminable signs or data. Generated identification maps are stored in the storage device 142.

In the iteration number n setting step (S106), the n setting unit 52 sets n as the number of times of iteration in performing a dose calculation. What is necessary here is just to set n=1, for the first time. Then, henceforth, the dose used for a mesh region concerned is to be calculated for each frame and for each mesh region in the frame.

In the judgment step (S108), the judging unit 53 judges whether the mesh region concerned is a mesh at the end of a figure or not. Specifically, the judging unit 53 judges for each mesh region whether the mesh region concerned is a mesh at the end of a figure or not by referring to an identification map stored in the storage device 142. In the case of the mesh concerned being at the end of a figure, it goes to the selection step (S112). In the case of the mesh concerned not being at the end of a figure, it goes to the judgment step (S110).

In the judgment step (S110), the judging unit 54 judges whether the mesh region concerned is a mesh at the inside of a figure or not. Specifically, the judging unit 53 judges for each mesh region whether the mesh region concerned is a mesh at the inside of a figure or not by referring to an identification map stored in the storage device 142. In the case of the mesh concerned being at the inside of a figure, it goes to the selection step (S112). In the case of the mesh concerned not being at the inside of a figure, it goes to the judgment step (S124).

In the selection step (S112), the selecting unit 56 selects, for each mesh region, one dose equation from a plurality of dose equations. In this case, two dose equations 1, and 2, are to be used. One dose equation that is the dose equation 1, used for a figure end is defined by the following equation (1): The dose equations 1, and 2, maybe set in the writing apparatus 100 in advance.

$$d_n(i) = \frac{1 + \eta(1 - bs_n(i))}{\frac{1}{2} + m^2 \eta g(0)} \quad (1)$$

In the equation (1), a dose correction coefficient $d_n(i)$, a back scattering coefficient $\eta$ of an electron beam, a back scattering distribution function $g(x)$ of an electron beam, a back scattering component coefficient $bs_n(i)$ and a mesh size m are used. n denotes the number of times of iterative calculation. i denotes a vector indicating coordinates of a mesh region. g (0) denotes the center value of a distribution function. In other words, in the case that the mesh region of the coordinate i is irradiated with the electron beam 200, g (0) indicates a dose distribution function value of an electron beam distributed in the concerned mesh region of the coordinate i.

Moreover, the other dose equation, that is the dose equation 2, used for the inside of a figure is defined by the following equation (2):

$$d_n(i) = \frac{1 + \eta(1 - bs_n(i))}{1 + m^2 \eta g(0)} \quad (2)$$

The back scattering component coefficient $bs_n$, (i) in the equations (1) and (2) is defined by the following equation (3):

$$bs_n(i) = m^2 \sum_{j \neq 0} g(j) d_{n-1}(i+j) \quad (3)$$

Figure 6:
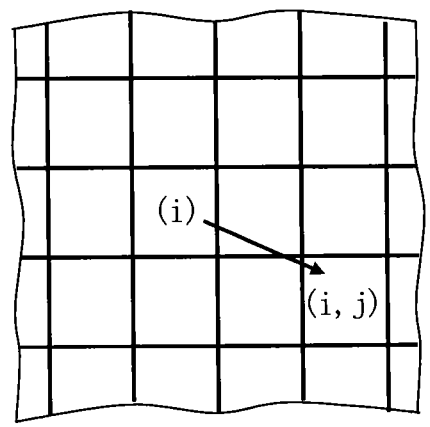
FIG. 6 shows an example of coordinates of a mesh region according to Embodiment 1.

FIG. 6 shows an example of coordinates of a mesh region according to Embodiment 1. As shown in FIG. 6, the vector j shows relative coordinates when referring to the mesh region of the coordinate i as a criterion. Therefore, the n-th back scattering component coefficient $bs_n$, (i) in the iterative calculation indicates a back scattering component coefficient in a mesh region (i), which is generated when other mesh regions (i+j) except for the mesh region (i) are irradiated with the electron beam 200 by using the (n-1)th dose correction coefficient $d_{n-1}$, in the iterative calculation in the mesh region (i+j).

In this case, the equation (1) is selected for a mesh region having been identified to be at the inside of a figure, and the equation (2) is selected for a mesh region having been identified to be at the end of a figure. Therefore, the dose (dose correction coefficient) calculated based on the dose equation 2, can be smaller than the dose (dose correction coefficient) calculated based on the dose equation 1. As described above, at the shot position inside the figure, where the influence of forward scattering can be ignored, it is ideally sufficient for the maximum value of irradiation energy to be the resolution threshold value Eth of the resist, thereby decreasing the maximum value of irradiation energy. Thus, an excessive dose can be eliminated.

In the $d_n(i, j)$ calculation step (S114), first, the $bs_n$ calculation unit 61, calculates, by using the equation (3), a back scattering component coefficient $bs_n(i)$ in the mesh region (i), which is generated when other mesh regions (i+j) except for the mesh region (i) are irradiated with the electron beam 200, by using the (n-1)th dose correction coefficient $d_{n-1}$, in the iterative calculation in the mesh region (i+j). The $bs_n$, calculation unit 61 is an example of a back scattering component function calculation unit. Then, the $d_n$, calculation unit 60 calculates for each mesh region, by using a selected dose equation (1, or 2), the n-th dose correction coefficient $d_n(i)$ in the iterative calculation of an electron beam to be shot in the mesh region concerned by performing an iterative calculation Although, in this case, the calculation processing is separately performed, such as performing calculation of the back scattering component coefficient $bs_n(i)$ by the $bs_n$, calculation unit 61, and calculation of the dose correction coefficient $d_n(i)$ by the $d_n$, calculation unit 60, it is also acceptable to calculate them simultaneously in one calculation processing.

As shown in the dose equation (1, or 2), the $d_n$ calculation unit 60 uses the n-th back scattering component coefficient $bs_n(i)$ in the iterative calculation when calculating the n-th dose correction coefficient $d_n$. Moreover, as shown in the dose equation (1, or 2), when calculating the n-th dose correction coefficient $d_n$, the $d_n$, calculation unit 60 uses a dose distribution function value g(0) of electron beam distributed in a mesh region concerned when the mesh region concerned is irradiated with the electron beam 200. The $d_n$, calculation unit 60 is an example of a dose coefficient calculation unit. Since n=1, is set in this case, a dose correction coefficient $d_1(i)$ is calculated. Then, in that case, a dose correction coefficient d0(i)=2ρ is defined as an initial value in the mesh region at the end of a figure, and a dose correction coefficient $d_0(i)$=ρ is defined as an initial value in the mesh region inside a figure. ρ indicates a value of the area density in the mesh region concerned.

In the $\delta_n(i,j)$ calculation step (S116), the $\delta_n$ calculation unit 62 calculates, for each mesh region, a rate of change from the (n-1)th dose correction coefficient $d_{n-1}$, to the n-th dose correction coefficient $d_n$, calculated in the n-th iterative calculation, as the n-th change rate $\delta_n$. The $\delta_n$, calculation unit 62 is an example of a change rate calculation unit. Since n=1, is set in this case, a dose correction coefficient $\delta_1(i)$ is calculated.

The change rate $\delta_n$, is defined by the following equation (4):

$$\delta_n(i) = \frac{d_n - d_{n-1}}{d_{n-1}} \quad (4)$$

In the judgment step (S118), the judging unit 63 judges whether the change rate $\delta_n$, is smaller than the allowable value $\Delta$ or not. When the change rate $\delta_n$, is smaller than the allowable value $\Delta$, it goes to the selection step (S120). When the change rate $\delta_n$ is not smaller than the allowable value $\Delta$, it goes to the judgment step (S119).

In the judgment step (S119), when the change rate $\delta_n$ is not smaller than the allowable value $\Delta$, the judging unit 72 judges whether a mesh region concerned is a mesh at the end of a figure or not. Specifically, the judging unit 53 judges, for each mesh region, whether the mesh region concerned is a mesh at the end of a figure or not by referring to an identification map stored in the storage device 142.

In the selection step (S120), the selecting unit 64 selects one dose equation from the plural dose equations 3, to 5 for correcting a dose correction coefficient $d_n$. The selecting unit 64 selects the dose equation 3, when the change rate $\delta_n$, is not smaller than the allowable value $\Delta$ and the mesh region concerned is a mesh at the end of a figure. The dose equation 3, is defined by the following equation (5). The dose equations 3, to 5, may be set in the writing apparatus 100 in advance.

$$d'_n(i) = d_n(i) - k \frac{\eta \delta_n b s_n(i)}{\frac{1}{2} + m^2 \eta g(0)} \quad (5)$$

In the equation (5), a corrected dose correction coefficient $d_n'$ (i), a change rate $\delta_n$, a back scattering coefficient $\eta$, a distribution function $g(x)$, a back scattering component coefficient $bs_n(i)$ and a mesh size m are used. The coefficient k is a value of $0 \leq$, k<1.

The selecting unit 64 selects the dose equation 4, when the change rate $\delta_n$, is not smaller than the allowable value $\Delta$ and the mesh region concerned is not a mesh at the end of a figure (namely, in the case of a mesh at the inside of a figure). The dose equation 4, is defined by the following equation (6):

$$d'_n(i) = d_n(i) - k \frac{\eta \delta_n b s_n(i)}{1 + m^2 \eta g(0)} \quad (6)$$

The selecting unit 64 selects the dose equation 5, when the change rate $\delta_n$, is smaller than the allowable value $\Delta$. The dose equation 5, is defined by the following equation (7): The coefficient a is a value of $0 \leq \alpha < 1$.

$$d'_n(i) = (1-\alpha) d_n(i) + \alpha d_{n-1}(i) \quad (7)$$

In the $d_n'(i,j)$ calculation step (S122), the $d_n'$ calculation unit 65 calculates a corrected dose correction coefficient $d_n'$ (i) by using a selected dose equation (3, 4,, or 5). By virtue of correcting the dose correction coefficient $d_n$, by using the dose equation (3, 4,, or 5), it becomes possible to expedite convergence of the dose correction coefficient $d_n$. In particular, when the change rate $6_n$, is not smaller than the allowable value $\Delta$, convergence can be further expedited by using the dose equation 3, or 4. Thus, the $d_n'$ calculation unit 65 corrects, for each mesh region, the n-th dose correction coefficient $d_n$, by using the n-th change rate $\delta_n$, in the case of using the dose equation 3, or 4. The $d_n'$ calculation unit 65 is an example of the correction calculation unit.

In the judgment step (S124), the judging unit 66 judges whether the calculation mentioned above has been completed for all the mesh regions in the frame concerned or not. When the above-described calculation has been completed for all the mesh regions, it goes to the substitution step (S126). When the calculation has not been completed for all the mesh regions, it returns to the judgment step (S108). Then, each step from the judgment step (S108) to the judgment step (S124) is repeated until the calculation described above has been completed for all the mesh regions in the frame concerned. By the method described above, with respect to n=1,, a corrected dose correction coefficient $d_1'$ (i) is calculated for each of all the mesh regions in the frame concerned.

In the substitution step (S126), the substitution unit 6substitutes (resets) a corrected dose correction coefficient $d_n'$ (i) for the dose correction coefficient $d_n$, (i).

In the judgment step (S128), the judging unit 68 judges whether n, being the number of times of iterative calculation, has become k, being a predetermined number of times, or not. When n has become k, it goes to the dose D calculation step (S132). When n has not become k yet, it goes to the addition step (S130).

In the addition step (S130), the addition unit 69 adds the value "1" to n being the number of times of iterative calculation which is currently set. Then, it returns to the judgment step (S108). Each step from the judgment step (S108) to the addition step (S130) is repeated until n being the number of times of iterative calculation becomes k being a predetermined number of times k. By the method described above, with respect to n=1, 2, ..., k, a dose correction coefficient $d_n$, (i) is calculated by being corrected and being substituted by a corrected dose correction coefficient $d_n'$ (i) in all the mesh regions in a frame concerned.

In addition, the back scattering component coefficient $bs_n$, (i), the dose correction coefficient $d_n$, (i), the dose correction coefficient $d_n'$ (i), and the change rate $\delta_n$, which were calculated in the step mentioned above are to be stored in the storage device 142 each time.

Figure 7:
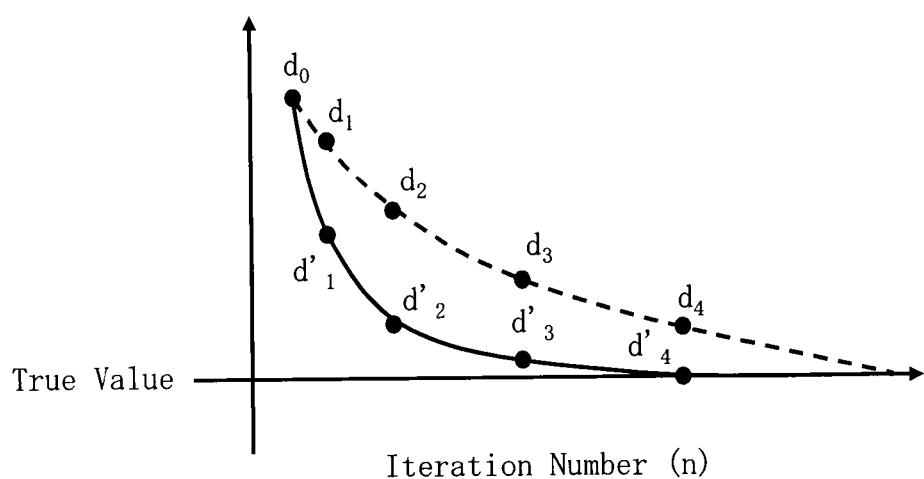
FIG. 7 is a schematic diagram showing a convergence speed difference between the dose correction coefficient according to Embodiment 1, and the dose correction coefficient conventionally used.

FIG. 7 is a schematic diagram showing a convergence speed difference between the dose correction coefficient according to Embodiment 1, and the dose correction coefficient conventionally used. The dotted line shows the case where a dose correction coefficient $d_n$, is obtained by an iterative calculation by using a conventional dose equation. By contrast, according to Embodiment 1,, since correction is performed by a dose equation (one of the equations 3, to 5), convergence speed can be increased and the solution of a dose equation can be converged to a true value by performing a smaller number of times of calculation.

Figure 8:
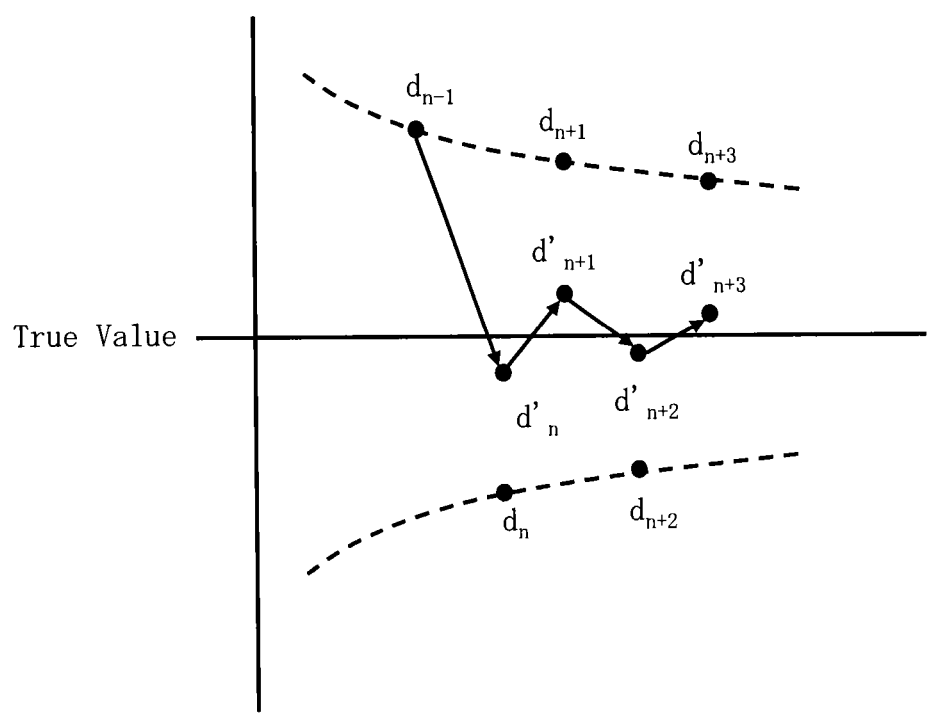
FIG. 8 is a schematic diagram explaining a method of convergence of a dose correction coefficient according to Embodiment 1.

FIG. 8 is a schematic diagram explaining a method of convergence of a dose correction coefficient according to Embodiment 1. Without correction using a dose equation (one of equations 3, to 5), the solution of a dose equation will follow a locus of a slow convergence speed as shown by the dotted line. On the other hand, by performing correction using a dose equation (one of equations 3, to 5), when performing an iterative calculation, the solution can be close to a true value gradually while repeating becoming higher than the true value and becoming lower than the true value.

Figure 9A:
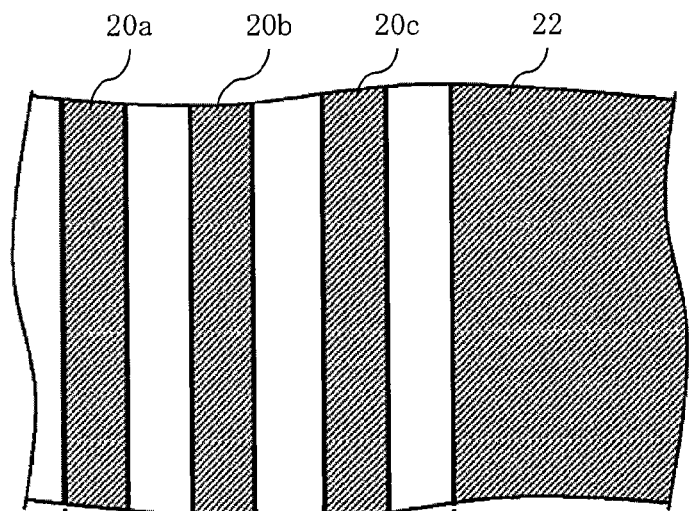
FIGS. 9A and 9B show an example of a dose for comparing with Embodiment 1.
Figure 9B:
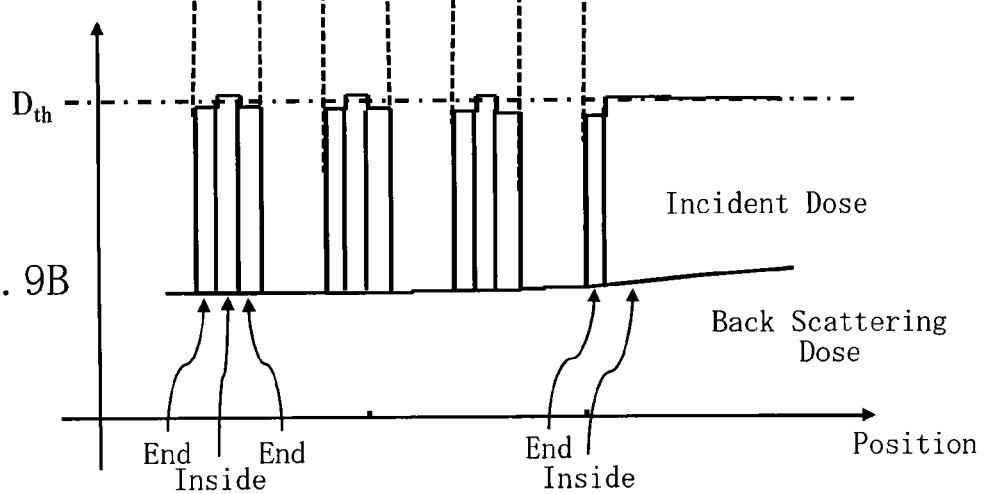
Figure 10:
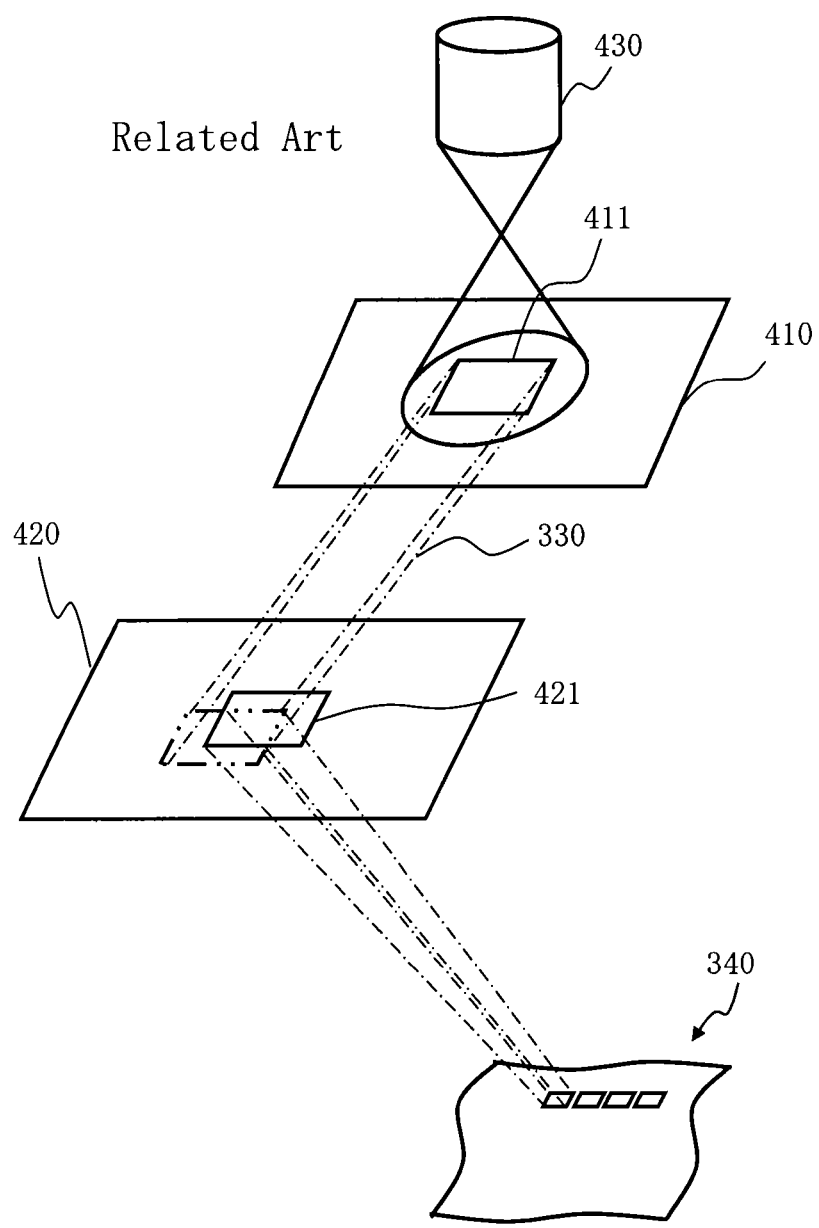
FIG. 10 is a schematic diagram explaining operations of a conventional variable shaped electron beam writing apparatus.

FIGS. 9A and 9B show an example of a dose for comparing with Embodiment 1. FIG. 9A shows a 1:1, line and space pattern 20. Then, a so-called solid pattern 22 whose area density is 100% is shown next to the line and space pattern 20. If a conventional dose equation is used when calculating a dose for writing such patterns, a dose profile as shown in FIG.

9B is obtained. The lower side of FIG. 9B shows a dose by a back scattering electron, and the upper side shows an incident dose. However, the incident dose at the end of a figure is expressed to be one half of the value of the actual value. As shown in FIG. 9B, since there is a case where calculation is finished before the solution of a dose equation converges in the case of using a conventional dose equation, the dose obtained may not reach the threshold value Dth. In particular, this state has a tendency to generate easily at the end of a figure. By contrast, according to Embodiment 1,, since the solution of a dose equation can be converged by the smaller number of times of iterative calculation, the dose obtained can be made to reach the threshold value Dth. Therefore, the case where a dose obtained does not reach the threshold value Dth like the conventional case can be avoided.

In the dose D calculation step (S132), the D calculation unit 70 calculates a dose D(i) of a mesh concerned by using the dose correction coefficient $d_n$, (i) which was obtained with respect to n=1, 2, ..., k and has been corrected and substituted by a corrected dose correction coefficient $d_n'$ (i), and the base dose $D_{basedose}$. The dose D(i) can be defined by the following equation (8):

$$D(x) = D_{basedose} \lim_{n \to \infty} d_n(i) \qquad (8)$$

Thus, the D calculation unit 70 calculates, for each mesh region, a dose D(i) of the electron beam 200 to be shot in the mesh region concerned by using a corrected n-th dose correction coefficient $d_n$, (i). The D calculation unit 70 is an example of the dose calculation unit.

In the irradiation time calculation step (S134), the irradiation time calculation unit 74 calculates an irradiation time T of the electron beam 200 in each shot. Since the dose D can be defined by a product of the irradiation time T and a current density J, the irradiation time T can be calculated by dividing the dose D by the current density J. The calculated irradiation time is output to the deflection control circuit 120.

In the writing step (S136), the writing unit 150 writes a desired pattern in a mesh region concerned by using the calculated dose, for each mesh region 22. Specifically, it operates as follows: The deflection control circuit 120 outputs a digital signal which controls an irradiation time for each shot, to the DAC amplifier unit 130. Then, the DAC amplifier unit 130 converts the digital signal into an analog signal and amplifies it to be applied as a deflection voltage to the blanking deflector 212.

When passing through the blanking deflector 212, the electron beam 200 emitted from the electron gun assembly 201 (emission unit) is controlled by the blanking deflector 212 to pass through the blanking aperture 214 when in the state of beam-ON, and is deflected so that the entire beam may be blocked by the blanking aperture 214 when in the state of beam-OFF. The electron beam 200 passing through the blanking aperture 214, while changing the state from the beam-OFF to the beam-ON and lastly again to the beam-OFF, serves as a one-time shot of the electron beam. The blanking deflector 212 controls the direction of the passing electron beam 200 to alternately generate the state of beam-ON and the state of beam-OFF. For example, voltage is not applied when in the state of beam-ON, and is applied to the blanking deflector 212 when in the state of beam-OFF. The dose per shot of the electron beam 200 to irradiate the target object 101 is adjusted by the irradiation time T of each shot.

The electron beam 200 of each shot generated by passing through the blanking deflector 212 and the blanking aperture 214 as described above irradiates the whole of the first shaping aperture 203, which has a rectangular opening, by the illumination lens 202. At this time, the electron beam 200 is first shaped to be a quadrangle such as a rectangle. Then, after having passed through the first shaping aperture 203, the electron beam 200 of a first aperture image is projected onto the second shaping aperture 206 by the projection lens 204. Then, the first aperture image on the second shaping aperture 206 is deflection-controlled by the deflector 205 so as to change the shape and size of the beam (variable shaping). Such variable shaping is performed for each shot, and, usually, each shot is shaped to be a beam having a different shape and size. After having passed through the second shaping aperture 206, the electron beam 200 of a second aperture image is focused by the objective lens 207, and deflected by the deflector 208, to reach a desired position on the target object placed on the XY stage 105 which moves continuously. As described above, by each deflector, a plurality of shots of the electron beam 200 are deflected, in order, onto the target object 101 serving as a substrate.

The calculation processing in each frame 20 is performed in order in real time in accordance with the advancement of the writing processing.

According to Embodiment 1, as described above, it is possible to properly select and use a dose equation depending upon the figure and the position. Therefore, it is possible to control the dose itself which is to be calculated and avoid an excessive dose. Moreover, by correcting the solution of a dose equation by using the dose equation described above, it is possible to expedite the convergence of the solution and reduce the operation time. Furthermore, it is possible to prevent the state in which an iterative calculation finishes before the solution of a dose equation converges. Consequently, it is possible avoid a risk of dose shortage. Accordingly, the writing time can be reduced and thereby, the throughput of the apparatus can be increased.

Embodiment has been explained referring to concrete examples described above. However, the present invention is not limited to these specific examples. In the example mentioned above, when the change rate $\delta_n$, is not smaller than the allowable value $\Delta$, correction is performed by using the dose equations 3, and 4, whose change rate is specially large, but it is not limited thereto. For example, it is also preferable to perform correction by using the dose equations 3, and 4,, whose change rate is large, in the first iterative calculation, and using the dose equation 5, in and after the second iterative calculation.

While the apparatus configuration, control method, etc. not directly necessary for explaining the present invention are not described, some or all of them may be suitably selected and used when needed. For example, although description of the configuration of a control unit for controlling the writing apparatus 100 is omitted, it should be understood that some or all of the configuration of the control unit is to be selected and used appropriately when necessary.

In addition, any other charged particle beam writing apparatus and method thereof that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein.

Accordingly, various modifications may be made without departing from the spirit or scope of the general inventive concept as defined by the appended claims and their equivalents.

What is claimed is:

1. A charged particle beam writing apparatus comprising:
a dose coefficient calculation unit configured to calculate an n-th dose correction coefficient in iterative calculation of a charged particle beam to be shot in a small region concerned by the iterative calculation, for each small region of a plurality of small regions made by virtually dividing a writing region of a target object into mesh-like regions;
a change rate calculation unit configured to calculate, for the each small region, a rate of change from an (n-1)th dose correction coefficient to the n-th dose correction coefficient calculated in the iterative calculation, as an n-th change rate;
a correction calculation unit configured to correct, for the each small region, the n-th dose correction coefficient by using the n-th change rate;
a dose calculation unit configured to calculate, for the each small region, a dose of a charged particle beam to be shot in a small region concerned by using the n-th dose correction coefficient corrected; and
a writing unit configured to write a desired pattern in the small region concerned by using the dose calculated.

2. The apparatus according to claim 1, further comprising:
a back scattering component function calculation unit configured to calculate, for the each small region, by using the (n-1)th dose correction coefficient, an n-th back scattering component coefficient that indicates a total of back scattering component coefficients of doses respectively accumulated in a plurality of other small regions except for the small region concerned when the small region concerned is irradiated with the charged particle beam,
wherein the dose coefficient calculation unit uses the n-th back scattering component coefficient when calculating the n-th dose correction coefficient.

3. The apparatus according to claim 2,
wherein when calculating the n-th dose correction coefficient, the dose coefficient calculation unit further uses a dose distribution function value of a charged particle beam distributed in the small region concerned when the small region concerned is irradiated with the charged particle beam.

4. The apparatus according to claim 1,
wherein the small region is divided by a size larger than an influence radius of forward scattering of the charged particle beam.

5. The apparatus according to claim 4,
wherein the small region is divided by a size larger size than a minimum shot size.

6. The apparatus according to claim 5, further comprising:
an area density calculation unit configured to calculate a pattern area density in each the small region.

7. The apparatus according to claim 6, further comprising:
an identification map generation unit configured to generate an identification map for identifying, for the each small region, whether a small region concerned is located at an end of a figure configuring a pattern to be written or inside the figure.

8. The apparatus according to claim 7,
wherein the small region concerned is identified to be located inside of a figure when corresponding to a first condition that a pattern area density of the small region concerned is 100% and pattern area densities of all small regions surrounding the small region concerned are 100% respectively.

9. The apparatus according to claim 8,
wherein the small region concerned is identified to be located at an end of a figure when not corresponding to the first condition but corresponding to a second condition that the pattern area density of the small region concerned is not 0%.

10. The apparatus according to claim 9, further comprising:
a first judging unit configured to judge, for the each small region, whether a small region concerned is at an end of a figure by referring to the identification map.

11. The apparatus according to claim 10, further comprising:
a second judging unit configured to judge, for the each small region, whether a small region concerned is inside a figure by referring to the identification map.

12. The apparatus according to claim 11, further comprising:
a selecting unit configured to select, for the each small region, a dose equation from a plurality of dose equations for calculating the dose correction coefficient, based on whether the small region concerned is at the end of the figure or inside the figure.

13. The apparatus according to claim 12,
wherein a dose correction coefficient calculated by a dose equation which is in the plurality of dose equations and selected based on that the small region concerned is inside the figure is smaller than a dose correction coefficient calculated by a dose equation which is in the plurality of dose equations and selected based on that the small region concerned is at the end of the figure.

14. A charged particle beam writing method comprising:
calculating an n-th dose correction coefficient in iterative calculation of a charged particle beam to be shot in a small region concerned by the iterative calculation, for each small region of a plurality of small regions made by virtually dividing a writing region of a target object into mesh-like regions;
calculating, for the each small region, a rate of change from an (n-1)th dose correction coefficient to the n-th dose correction coefficient calculated in the iterative calculation, as an n-th change rate;
correcting, for the each small region, the n-th dose correction coefficient by using the n-th change rate;
calculating, for the each small region, a dose of a charged particle beam to be shot in the small region concerned by using the n-th dose correction coefficient corrected; and
writing a desired pattern in the small region concerned by using the dose calculated.

15. The method according to claim 14, further comprising:
calculating, for the each small region, by using the (n-1)th dose correction coefficient, an n-th back scattering component coefficient that indicates a total of back scattering component coefficients of doses respectively accumulated in a plurality of other small regions except for the small region concerned when the small region concerned is irradiated with the charged particle beam,
wherein the n-th back scattering component coefficient is used when calculating the n-th dose correction coefficient.

16. The method according to claim 15,
wherein when calculating the n-th dose correction coefficient, a dose distribution function value of a charged particle beam distributed in the small region concerned is used when the small region concerned is irradiated with the charged particle beam.

17. The method according to claim 14,
wherein the small region is divided by a size larger than an influence radius of forward scattering of the charged particle beam, and by a size larger size than a minimum shot size, further comprising:

calculating a pattern area density in each the small region; and generating an identification map for identifying, for the each small region, whether a small region concerned is located at an end of a figure configuring a pattern to be written or inside the figure.

18. The method according to claim 17,
wherein the small region concerned is identified to be located inside of a figure when corresponding to a first condition that a pattern area density of the small region concerned is 100% and pattern area densities of all small regions surrounding the small region concerned are 100% respectively, and is identified to be located at an end of a figure when not corresponding to the first condition but corresponding to a second condition that the pattern area density of the small region concerned is not 0%.

19. The method according to claim 18, further comprising:
selecting, for the each small region, a dose equation from a plurality of dose equations for calculating the dose correction coefficient, based on whether the small region concerned is at the end of the figure or inside the figure.

20. The apparatus according to claim 19,
wherein a dose correction coefficient calculated by a dose equation which is in the plurality of dose equations and selected based on that the small region concerned is inside the figure is smaller than a dose correction coefficient calculated by a dose equation which is in the plurality of dose equations and selected based on that the small region concerned is at the end of the figure.

* * * * *